United States Patent
Bakowski et al.

[11] Patent Number: 5,914,500
[45] Date of Patent: Jun. 22, 1999

[54] JUNCTION TERMINATION FOR SIC SCHOTTKY DIODE

[75] Inventors: Mietek Bakowski, Skultuna; Ulf Gustafsson, Linkoping, both of Sweden

[73] Assignee: ABB Research Ltd., Zurich, Switzerland

[21] Appl. No.: 08/821,159

[22] Filed: Mar. 20, 1997

[30] Foreign Application Priority Data

Jan. 21, 1997 [SE] Sweden ................................... 9700156

[51] Int. Cl.$^6$ ..................... H01L 31/0312; H01L 27/095; H01L 29/47; H01L 29/812
[52] U.S. Cl. ........................... 257/77; 257/472; 257/475; 257/483; 257/485
[58] Field of Search ............................. 257/77, 472, 473, 257/475, 483, 485

[56] References Cited

U.S. PATENT DOCUMENTS

| | | | |
|---|---|---|---|
| 4,310,362 | 1/1982 | Roche et al. | 148/1.5 |
| 4,559,238 | 12/1985 | Bujnhi et al. | 427/82 |
| 4,648,174 | 3/1987 | Temple et al. | 29/578 |
| 4,667,393 | 5/1987 | Ferla et al. | 29/576 |
| 4,927,772 | 5/1990 | Arthur et al. | 437/6 |
| 5,233,215 | 8/1993 | Baliga | 257/490 |
| 5,459,089 | 10/1995 | Baliga | 437/40 |
| 5,569,937 | 10/1996 | Bhatnagar et al. | 257/77 |

FOREIGN PATENT DOCUMENTS

WO 96/03774  2/1996  WIPO.

OTHER PUBLICATIONS

Ueno et al., Al/Ti Schottky Barrier Diodes with the Guard–Ring Termination for 6H–SiC, Proceedings of 1995 International Symposium on Power Semiconductor Devices & ICs, Yokohama, pp. 107–111.

Baliga, Modern Power Devices, p. 437, John Wiley & Sons, 1985.

Bhatnagar et al., Silicon–Carbide High–Voltage (400 V) Schottky Barrier Diodes,IEEE Electron Device Letters, vol. 13, No. 10, Oct. 1992, pp. 501–503.

Alok et al., Argon Implanted SiC Device Edge Termination: Modelling, Analysis and Experimental Results; Inst. Phys. Conf. Ser. No. 142, Chap. 3, Paper presented at Silicon Carbide and Related Materials 1995 Conf. Kyoto, Japan, 1996 IOP Publishing Ltd. pp. 565–568.

Itoh et al., Low Power–Loss 4H–SiC Schottky Rectifiers With High Blocking Voltage, Inst. Phys. Conf. Ser. No. 142, Chapter 4, Paper presented at Silicon Carbide and Related Materials 1995 Conf. Kyoto, Japan, 1996 IOP Publishing Ltd. pp. 689–692.

Kimoto et al., High –Voltage (>1kV) SiC Schottky Barrier Diodes With Low On–Resistances, IEEE Electron Device Letters, vol. 14, No. 12, Dec. 1993, pp. 548–550.

Stephani, Recent Progress on SiC–Based Devices, Scientific Program & Book Of Abstracts, ECSCRM '96, 1st European Conf. on Silicon Carbide and Related Materials, Oct. 1996.

Patent Abstracts of Japan, 1994, Publication No. 06268202 A.

*Primary Examiner*—Ngân V. Ngô
*Attorney, Agent, or Firm*—Pollock, Vande Sande & Priddy

[57] ABSTRACT

A semiconductor diode structure with a Schottky junction, wherein a metal contact and a silicon carbide semiconductor layer of a first conducting type form the junction and wherein the edge of the junction exhibits a junction termination divided into a transition belt (TB) having gradually increasing total charge or effective sheet charge density closest to the metal contact and a Junction Termination Extension (JTE) outside the transition belt, the JTE having a charge profile with a stepwise or uniformly deceasing total charge or effective sheet charge density from an initial value to a zero or almost zero total charge at the outermost edge of the termination following a radial direction from the center part of the JTE towards the outermost edge of the termination. The purpose of the transition belt is to reduce the electric field concentration at the edge of the metal contact of the Schottky diode, while the purpose of the junction termination extension is to control the electric field at the periphery of the diode.

17 Claims, 3 Drawing Sheets

JUNCTION TERMINATION FOR SIC SCHOTTKY DIODE

TECHNICAL FIELD

The invention relates to a metal-semiconductor junction device, known as a Schottky diode semiconductor device, with silicon carbide as a base material, wherein the risk of voltage breakdown due to a strong electric field at the edge of the junction, i. e. the contact surface between the metal and a contacting semiconducting layer is reduced as the junction contains an edge termination with a decreasing charge, or charge density, of the semiconductor layer surrounding the metal contact in a direction away from the junction.

BACKGROUND OF THE INVENTION

Semiconductor devices based on silicon carbide as a base material are continuously developed to be used in connection with high temperatures, high power applications, and under high radiation conditions. Under such circumstances conventional semiconductors do not work satisfactorily. Evaluations indicate that SiC semiconductors of power MOSFET-type, and diode rectifiers based on SiC, would be able to operate over a greater voltage and temperature interval, e.g. up to 650–800° C., and show better switching properties such as lower losses and higher working frequencies and nevertheless have a volume 20 times smaller than corresponding silicon devices. These possible improvements are based on the favorable material properties that silicon carbide possesses in relation to silicon, such properties, for example being a higher breakdown field (up to 10 times higher than silicon), a higher thermal conductivity (more than 3 times higher than silicon), and a higher energy band gap (2.9 eV for 6H—SiC, one of the crystal structures of SiC).

As SiC semiconductor technology is relatively new and in many aspects immature, there are many critical manufacturing problems which are to be solved before SiC semiconductor devices may be realized experimentally, and manufacturing in a large number may become a reality. This is especially true of devices intended for use in high-power and high-voltage applications.

One of the difficulties to overcome when manufacturing high voltage diodes or other types of semiconductor devices comprising a voltage absorbing pn junction is to produce a proper junction termination at the edge of the junction. The electric field at the periphery of the junction is normally enhanced compared to the electric field in the bulk of the junction. This field increase at the periphery of the junction may be further reinforced in the presence of surface charge.

A high electric field at the edge of the pn junction implies a great risk of voltage breakdown or flash-over at the edge of the junction and gives an instability of blocking voltage known as voltage drift.

To avoid the above-mentioned disadvantages, it becomes very important to reduce the field concentration where the junction reaches the surface. Combined with efforts to passivate the surface of the component, measures are taken to flatten the electric field at the surface e.g. by acting on how the pn junction emerges at the surface. As an example, it is known from silicon power components to lap (grind, sandblast, etch) the surface of the edge to a certain angle in relation to the pn junction to thereby flatten the field. Another known technique is to gradually decrease the doping on the highly doped side of the junction so that the doping is reduced towards the outermost edge of the junction (the so called Junction Termination Extension, JTE). The methods, known from silicon technology, used to achieve a JTE of an Si component are difficult or almost impossible to apply to components based on silicon carbide due to the great hardness of the material and extremely low diffusivity of proper SiC dopants.

The above-mentioned problems have not been solved for pn junctions in SiC. Many of the problems to be solved when developing semiconductor devices from SiC are reminiscent of those prevalent at the beginning of the development of corresponding silicon components. Yet, the same techniques as those applicable to silicon cannot be utilized when solving the specific problems related to production of SiC semiconductor devices. As an example, doping through diffusion is not feasible for SiC, since diffusion coefficients are negligible below 2270° K. Also, ion implantation of doping elements, a common technique when manufacturing Si components, is difficult to master and is not yet fully developed for SiC.

Solutions for arriving at SiC components comprising pn junctions with JTEs are described in the U.S. patent application Ser. No. 08/520 689 not yet published, which is hereby included in this description by reference. This application discloses MESA structure pn junctions having Junction Termination Extensions. A junction termination for a Schottky diode is disclosed in document JP, A, 06268202. The component of this JP document has an insulating film with an aperture for an active Schottky layer. Still, this solution is not sufficient to solve the problem with a too high electric field concentration at the edge of the junction.

Junction termination, using gradually diminishing doping on the highly doped side of the pn-junction at the periphery of the pn junction, is an effective way to secure blocking capability for high voltage semiconcuctors. JTE techniques for SIC pn junctions have been described for mesa-structures in the above-mentioned U.S. patent application Ser. No. 08/520 689. The solutions described there involve stepwise decreasing charges of the JTE towards the edge of the JTE by use of an etch-down technique, epitaxial regrowth or ion implatation in order to control the surface doping and surface fields.

Junction terminations (JT) for high voltage Schottky diodes present an additional challenge in an effort to reach high voltage levels for the device compared to the JT for so-called PIN-diodes where a normal pn junction is provided with a high doped p-layer, a high doped n-layer, and in between an intermediate doped n-layer for voltage blocking purposes. here are two main reasons for that. First, the electric field maximum determining the breakdown level is situated much loser to the semiconductor surface (FIG. 1a, point A) than in the case of the PIN diode. This entails much more severe stress to the interface between the SiC surface and a passivating and severe stress to a passivating insulator layer itself during voltage blocking by the diode. A second reason is that compared to the PIN diode (FIG. 1b) provided with a JTE, there is one extra region where the crowding of the potential lines and high electric field have to be avoided. This region is at the transition between the Schottky (metal) contact and a Junction Termination area (FIG. 1c, point B), where it is illustrated that although efforts have been made by means of a resistive JTE to reduce the field maximum at the edge of the Schottky junction, thus displacing the field maximum laterally outwardly to point A at the edge of the space charge region, another point B with a field maximum has appeared.

Several methods to control the electric field at the surface of the Schottky diodes have been published during the last couple of years. Most of the known methods are concerned, however, with the problem related to the electric field enhancement at point A, indicated above. This problem is identical with that encountered in all bipolar devices as well. Solutions to the problem are discussed and solved by the use of field rings in M. Bhatnagar, P. K. Mc Larty, and B. J. Baliga, IEEE Electron Device Letter, 13, 501 (1992), by the use of the effect of damage and doping on the effective surface charge in D. Alok, B. J. Baliga, M. Kothandaraman and P. K. Mc Larty, Proc of 6th Silicon Carbide and Related Materials Conf., Inst. Phys., Ser. 142, 565 (1995), in A. Itoh, T. Kimoto, and H. Matsunami, Proc of 6th 6th Silicon Carbide and Related Materials Conf., Inst. Phys. Ser. 142, 689 (1995)

in T. Kimoto, T. Urushidani, S. Kobayashi and H. Matsunami, IEEE Electron Device Lett., 14, 548, (1993)

by the use of JTE termination techniques in D. Stephani, Abstracts of 1st European Conf. Silicon Carbide and Rel. Materials, 92 (1996).

Only the use of the LOCOS oxidation technique in K. Ueno, T. Urushidani, K Hashimoto and Y Seki, Proc. of 7th Int. Symp. Power Semicond. Devices and Ics, 107 (1995) is devoted to controlling the electric field enhancement at point B and is here referred to as the only prior art document adressing this problem together with other techniques known from the field of silicon devices such as the use of an oxide field plate and the use of a field ring described in Baliga, Modern Power Devices. John Wiley & sons, p 437 (1985).

The proper termination of the Schottky diode junction has to be constructed in such a way that both field enhancements in points A and B are controlled at the same time so that none of them is dominating, and alone determines, the behaviour of the diode at a high voltage blocking voltage applied to it.

It is a general property of the Schottky diode, and as such distinct from any bipolar diode, that the field enhancement at point B will always persist when known JT methods like an implanted field ring of a directly applied JTE of the type described in above mentioned U.S. patent application Ser. No. 08/520,689 are used. This is due to the fact that metal replacing one side of the pn junction in the Schottky diode does not create a space charge absorbing some of the potential and the electric field. This makes the transition between the Schottky contact area abrupt causing a field enhancement as discussed.

In the following a number of methods to realize a component as charactized in the device claims are disclosed.

The term SiC is used in the following text to refer to any of the principal crystal polytypes of this material known as 6H, 4H, 2H, 3C and 15R.

SUMMARY OF THE INVENTION

One aspect of the invention includes a semiconductor diode structure, which comprises a Schottky junction, wherein metal contact and a silicon carbide semiconducting layer of a first conducting type form the junction and where the edge of the junction exhibits a junction termination divided into a transition belt (TB) having gradually increasing total charge, or effective sheet charge density sited closest to the metal contact and a Junction Termination Extension (JTE) outside the transition belt, such JTE having a charge profile with a stepwise or uniformly decreasing total charge, or effective sheet charge density, from an initial value to a zero, or almost zero, total charge at the outermost edge of the termination following a radial direction from the center part of the JTE towards the outermost edge of the termination. The purpose of the transition belt is to reduce the electric field concentration at the edge of the metal contact of the Schottky diode, while the purpose of the Junction Termination Extension is to control the electric field at the periphery of the diode.

Other aspects of the invention further comprise methods for producing the SiC semiconductor device with increasing charge profile for the transition belt and with decreasing charge profile for the junction termination extension defined by the method claims.

By manufacturing an SiC Schottky diode with the features described, the concentration of the electric field, when a high reverse voltage is applied to the junction, is eliminated as the electric field is flattened along the extended edge termination. A low electric field in the lateral direction is achieved. Hence, the risk of a voltage breakdown is reduced at the edge of the junction before a breakdown somewhere at the metal contact area of the junction. By forming the edges of a Schottky junction of SiC material according to the aspects of the invention, the reverse voltage across the junction may be considerably increased (3 times and more) before a breakdown occurs.

Furthermore, the reliability and long-term stability are improved. This is due to the reduction of the electric field in the SiC material at the periphery of the junction. The maximum surface electric field must be reduced by at least one order of magnitude as long as the passivation schemes known from Si technology are used. Taking the measures disclosed relieves the stress inflicted on the passivation and isolation of the junction.

A low lateral electric field at an interface between a JT surface to a passivation layer is vital to a proper function of the JT. Unnecessary electric field peaks may be detrimental to the short- and long-term stability of the component. Hence, one purpose of the invention is to establish a component with a metal-SiC Schottky junction where electric field peaks between zones of different charge contents of the JT are reduced to a minimum.

The SiC semiconductor device is manufactured according to the invention by means of one of the alternative methods described below which have in common that the junction has a termination with, at first, a region with increasing total charge concentration followed by a region with decreasing total charge concentration towards the outer edge as characterized in the device claims.

A first method (1) of achieving the component according to the invention is arrived at by starting with a silicon carbide wafer of a planar structure comprising a weakly doped layer of a first conducting type. On the plane surface of the wafer, a metal contact layer is applied. These two layers constitute a junction for forming a Schottky barrier. According to the first method, (1), a junction termination extension is achieved by a combination of LOCOS technique, known from Si technology constituting the transition belt, and a JTE formed by a number of doped zones by means of ion implantation for forming zones of a second conducting type at the surface of the wafer. The LOCOS technique is used to epitaxially grow a first tapered zone of the second conducting type material around the Schottky junction. Surrounding this transition belt, a number of zones for forming a JTE are implanted with the second conducting type material. These zones of the JTE are performed so that the total charge and/or effective sheet charge density (such underlined expression being hereafter referred to as charge level) of the second type material decreases in the direction laterally away from the junction. The decreasing charge level is either continuous or stepwise. The LOCOS technique is used to reduce the field at the transition between the Schottky barrier and the first of the implanted zones. The field reduction is achieved by the tapered form of the second conducting type LOCOS manufactured transition belt, giving the transition belt a gradually increasing effective second conducting type material concentration outwardly from the junction. The extra implanted zones are necessary to properly control the field at the periphery of the junction.

An alternative method for realizing a Schottky diode according to another aspect of the invention is disclosed in a method (2). On a planar wafer of a first conducting type layer, a Schottky contact is applied. Outside and surrounding the contact, and facing the surface of the semiconducting layer, a transition belt is established. Surrounding the transition belt, in turn, and facing the surface of the layer, a JTE is applied. The transition belt has a plurality of zones of the second conducting type material implanted, wherein the charge level of each zone decreases in the lateral direction away from the junction. Outside and surounding the transition belt, there is a JTE, which has a plurality of zones of the second conducting type material implanted, where the charge level of each zone decreases in the lateral direction away from the junction.

In another alternative method, (3), of arriving at the Schottky junction as characterized by the claims also starting with a silicon carbide wafer of a planar structure comprising a first low-doped layer of a first conducting type material, a second layer of a second conducting type material is epitaxially grown on top of the first layer. In an etching procedure, a trench is formed in the centre of the second layer, whereby the Schottky contact is later applied in the trench, while the surrounding second layer is etched down in this method in one or a plurality of steps to form steps of decreasing thickness of the second layer. This forms a junction termination extension, a JTE, of the Schottky junction with decreasing charge level of the etched-down zones outwardly from the junction. The epitaxially built second layer acts as a guard ring around the Schottky contact. The charge level of the zones controls the electric field, both at the transition belt formed by a tapered wall of the trench between the Schottky barrier region and the JTE region, and at the JTE periphery. The electric field at the transition belt between the Schottky barrier region and the JTE region is further controlled by an angle, (a), at which the first JTE zone is etched on its inner side forming the trench for the Schottky contact.

DETAILED DESCRIPTION OF PREFERRED EMBODIMENTS

The invention will be described in a number of embodiments with reference to the drawings.

Figure 1A:
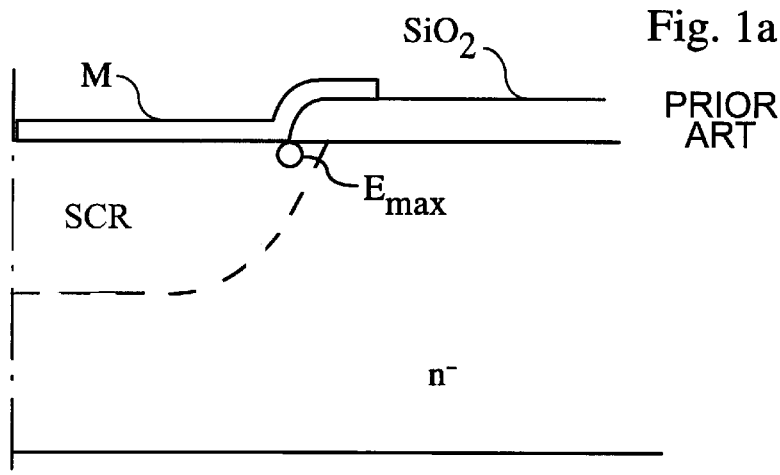
FIG. 1a schematically illustrates a section through a Schottky junction pointing out the maximum electric field at the edge of the space charge region with no junction termination.
Figure 1B:
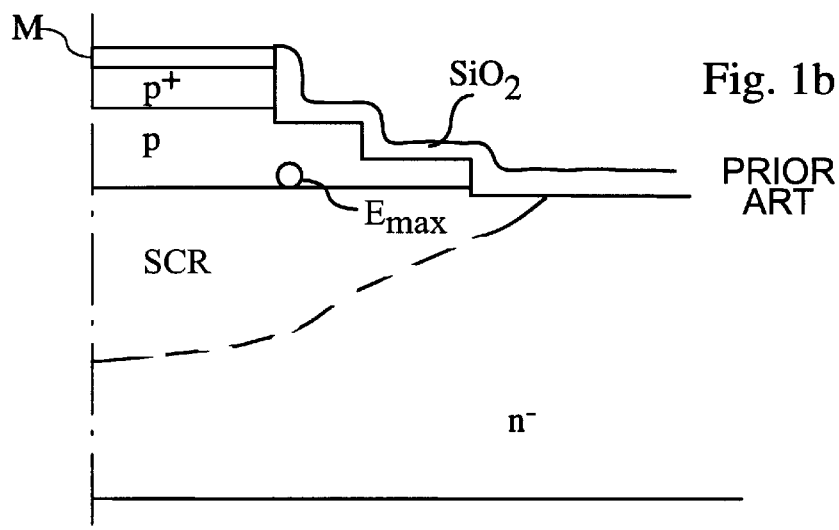
FIG. 1b schematically illustrates a section through a p-i-n diode junction pointing out the maximum electric field at the edge of the space charge region with a stepped down Junction Termination.
Figure 1C:
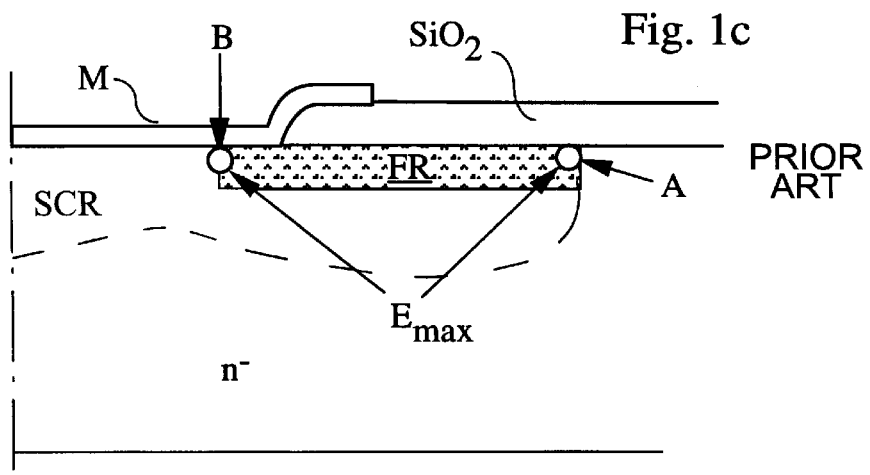
FIG. 1c schematically shows a section through a Schottky junction with a resistive Junction Termination, where two maximum electric field points are indicated.

In prior art junction terminations as shown in FIGS. 1a and 1c, M denotes a metal contact forming one contact of a Schottky junction. In FIG. 1b, M denotes a contact layer of a pin-diode. A passivation layer, for example consisting of $SiO_2$, covers the unshielded area outside the edge of the respective junctions. SCR denotes the space charge region of the depleted junction. The reference letters FR of FIG. 1c symbolize a resistive layer functioning as a so-called field ring junction termination. The dots denoted by E$max$ indicate points where the electric field is concentrated.

Figure 2:
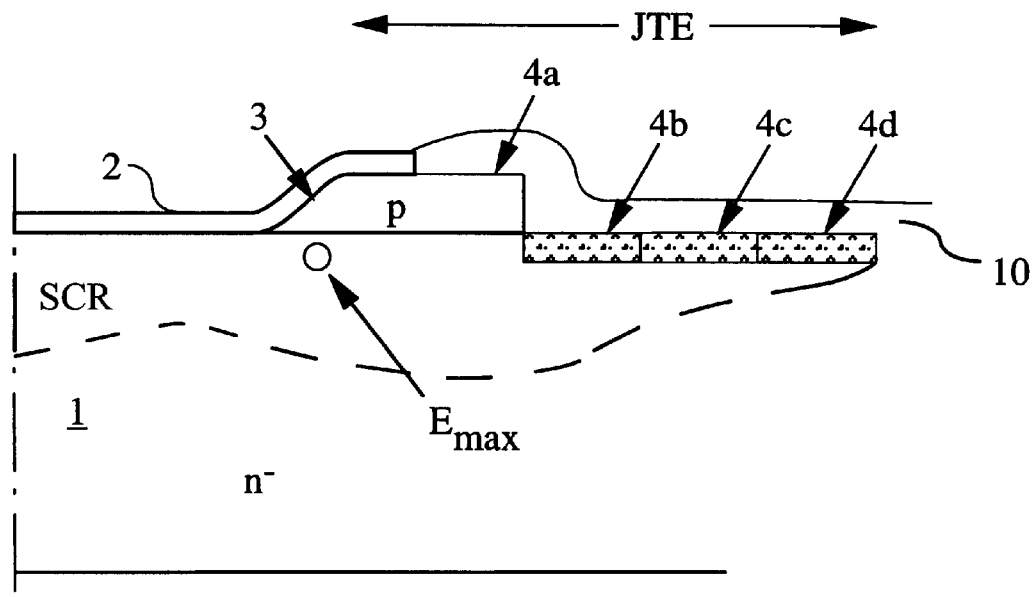
FIG. 2 illustrates a section through a Schottky junction manufactored by method (1) according to one aspect of the invention indicating the transition belt and a three-zone JTE.

FIG. 2 illustrates an example of an SiC semiconductor device having a transition belt and a JTE according to one aspect of the invention. The semiconductor is exemplified by a diode manufactured in SiC. The component of FIG. 2 is built on a substrate of SiC consisting of a low-doped ($n^-$), n-conducting, layer 1 forming a cathode of the diode. On top of this $n^-$-layer 1 and contacting the surface of the $n^-$-layer 1, a Shottky metal contact layer 2 is applied. These two layers 1, 2 compose a junction of a Schottky diode. Facing the surface of the substrate and around the metal contact a junction termination is provided. As shown by this example, the termination comprises a four-zone JTE (4a, 4b, 4c, 4d) of p-type conductivity.

Between the metal contact 2 and the JTE, there is provided a transition belt 3 also of p-type material applied by means of LOCOS oxidation technique which is known from silicon technology and therefore not described here.

The region, the transition belt 3, formed by use of the LOCOS technique has the charge level $Q_1$ and is given a field reduction property by means of a tapered form of the p-type layer so that the thickness of this transition belt increases in the direction outwardly from the Schottky junction, thereby imparting to the transition belt a gradually increasing effective p-type surface concentration. The first zone 4a of the JTE is the same as the outer part of the zone which at its inner part is tapered and forms the transition belt 3. The charge levels of all four zones 4a, 4b, 4c and 4d have the charge level relation $Q_1 > Q_2 > Q_3 > Q_4$.

The JTE zones are processed by use of implantation in a stepwise masking and implantation process as described in U.S patent application Ser. No. 08/683,059. By means of a continuous demasking process or a change in the intensity of the ion implantation beam, a continuous decrease of the charge level of the JTE may also be accomplished. The lateral flattening of the space charge region, as compared to the Schottky diode of FIG. 1a is pointed out by the depletion region, border indicated by the dashed line in FIG. 2. Further the point with the maximum electric field $E_{max}$ has now been moved to a position a distance away from the Schottky contact due to a decreased crowding of the potential lines next to the border of the metal contact 2. A passivation layer 10, e.g. made from $SiO_2$ is shown in FIG. 2.

In a preferred embodiment, the charge density of each JTE zone 4a, 4b, 4c and 4d is expressed by the relation $$Q_1:Q_2:Q_3:Q_4=100:(50-100):(25-75):(0-50)$$

where $Q_1$, denotes the doping level of the innermost zone of the JTE,4a, $Q_2$ the innermost zone 4b but one and so on. The value 100 denotes the charge density in the zone with the highest doping in the JTE with a four-zone embodiment. The value 100 also corresponds to a doping such that the zone with this charge density is completely depleted at full design voltage.

For a two-zone JTE the relation is expressed as $Q_1:Q_2=100:(25-75)$, optimally $Q_1:Q_2=100:(50-60)$, while the doping level of a one-zone JTE is 25–75% of the charge density contained within the space charge region of the described pn junction with full voltage for which it is designed applied to it, herein referred to as the characteristic charge density $Q_0$.

Figure 3:
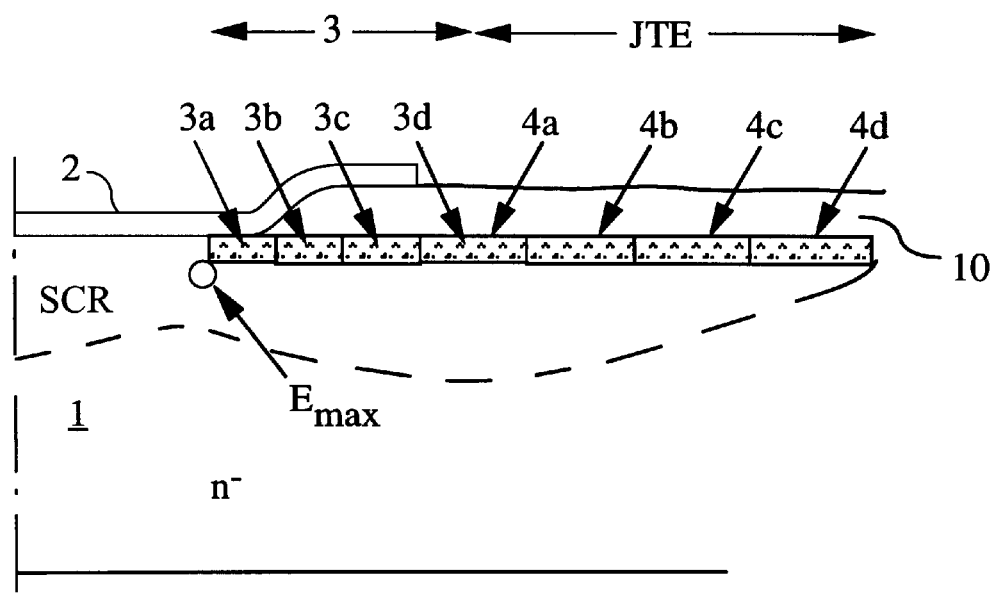
FIG. 3 depicts a section through a Schottky junction manufactored by method (2) according to one aspect of the invention indicating a four-zone transition belt and a four-zone JTE.

Another embodiment depicted in FIG. 3 is an example of an SiC semiconductor device having a transition belt, and a JTE according to a further aspect of the invention. The semiconductor is exemplified by a diode manufactured in SiC. The component of FIG. 3 is built on a substrate of SiC consisting of a low-doped (n⁻), n-conducting, layer 1 forming a cathode of the diode. On top of this n⁻-layer 1, and contacting the surface of the n⁻-layer 1, a Shottky metal contact layer 2 is applied. These two layers 1, 2 compose a junction of a Schottky diode. Facing the surface of the substrate and around the metal contact, a junction termination is provided. As shown by this example the termination comprises a four-zone JTE (4a, 4b, 4c, 4d) of p-type conductivity.

Between the metal contact 2 and the JTE there is provided a transition belt 3 comprising a plurality of zones 3a, 3b, 3c and 3d also of a p-type conductivity material applied by means of ion implantation. The charge levels provided to the zones 3a, 3b, 3c, 3d of the transition belt increase in a direction outwardly from the Schottky junction, thereby imparting to the transition belt a gradually increasing effective p-type surface concentration. The inner zone 4a of the JTE is the same as the outermost zone 3d forming the transition belt 3. The charge levels of all four zones 4a, 4b, 4c and 4d have the charge level relation $Q_1>Q_2>Q_3>Q_4$. The corresponding charge levels of the transition belt zones 3a, 3b, 3c, 3d have the charge levels $Q_4<Q_3<Q_2<Q_1$. The JTE zones and the zones forming the transition belt 3 are processed by use of implantation in a stepwise masking and implantation process as described in U.S. patent application Ser. No. 08/683,059. By means of a continuous demasking process, or a change in the intensity of the ion implantation beam, a continuous decrease of the charge level of the JTE may also be accomplished. The lateral flattening of the space charge region as compared to the Schottky diode of FIG. 1a is pointed out by the depletion region border indicated by the dashed line in FIG. 3. Further, the point with the maximum electric field $E_{max}$ has now been displaced to a position a distance away from the Schottky contact due to a decreased crowding of the potential lines next to the border of the metal contact 2.

In a preferred embodiment the charge level of each JTE zone 4a, 4b, 4c, 4d as well as the charge level of each transition belt zone 3d, 3c, 3b, 3a is expressed by the relation $$Q_1:Q_2:Q_3:Q_4=100:(50-100):(25-75):(0-50)$$

where $Q_1$ denotes the charge level of the outermost zone 3d of the TB and the innermost zone of the JTE 4a; $Q_2$ the outermost zone but one of the TB, and the innermost zone 4b but one of the JTE and so on. The value 100 denotes the charge density in the zone with the highest doping in the JTE as well as the zone with the highest doping of the TB in this example, zone 4a, and also 3d. The value 100 also corresponds to a doping so that the zone with this charge density ($Q_0$)is completely depleted at full design voltage.

For a two-zone JTE and a two-zone TB, the relation is expressed as $Q_1:Q_2=100:(25-75)$, while the doping level of a one zone JTE is 25–75% of the charge density contained within the space charge region of the described pn junction with full voltage for which it is designed applied to it, here referred to as the characteristic charge density $Q_0$.

As is understood, the outermost zone 4d of the JTE and the innermost zone 3a of the TB have the same charge levels ($Q_4$).

Figure 4:
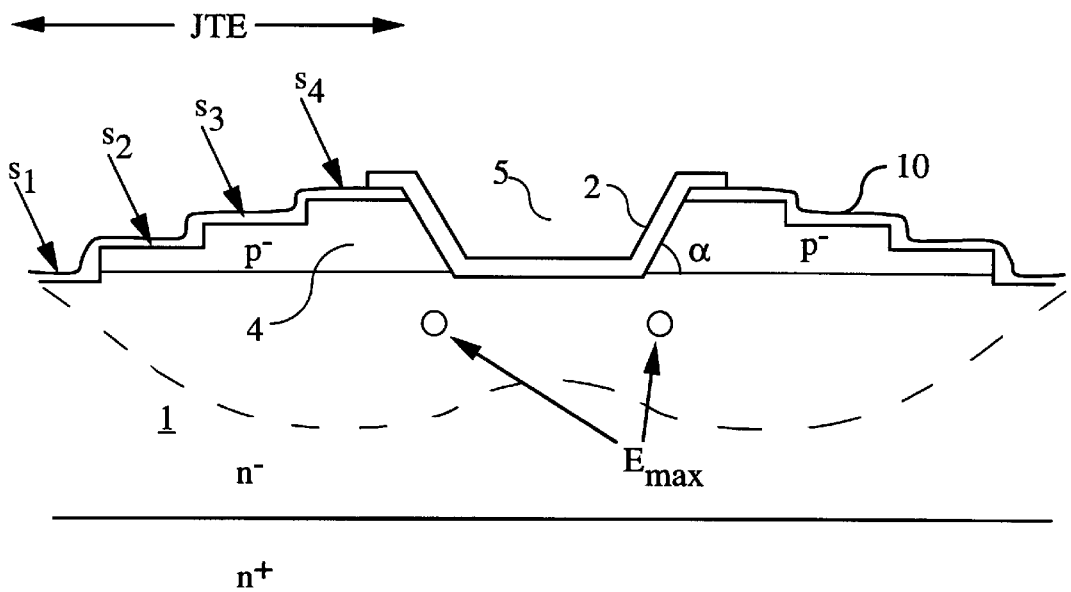
FIG. 4 shows a section through a Schottky junction manufactored by method (3) according to one aspect of the invention indicating a Schottky contact in a trench, the transition belt formed by a tapered wall of the trench and a four-zone JTE.

A further embodiment of the invention is described referring to FIG. 4. The component of FIG. 4 is built on a substrate of SiC comprising a low-doped n-conducting layer 1 forming a cathode of the diode. On top of this layer 1, a second layer 4 of a low-doped p conducting type SiC material is epitaxially grown. Then, in a masking and etching procedure, this second layer 4 is etched down, according to this example, in steps, such that four steps, $s_1$ to $s_4$, with decreasing thickness of the second layer outwards from the center of the diode are established, thus forming a guard ring with decreasing charge level outwardly in association with the consecutive steps.

As an alternative, a lateral growing of the second layer 4 as a JTE layer, with a continuous decreasing thickness, is an example where a continuous decreasing charge level is established. During the etching steps a region in the center of the second layer 4 is unmasked and exposed to the etching medium, resulting in an etched-down trench 5. This trench 5 is formed with tapered walls having an inclination of an angle α. Inside the trench, a Schottky metal contact layer 2 is applied contacting the surface of the n⁻-layer 1 for establishing a Schottky junction by layers 1 and 2. The metal contact also covers the tapered walls inside the trench formed in the second layer 4. The mentioned guard ring acts as a JTE of the achieved junction. The tapered region of the trench forms a transition belt TB, wherein the angle α of the walls of the trench controls the electric field between the junction and the JTE region. The angle α can be controlled by the choice of the plasma etching parameters. See, for instance D. Plason, M. L. Locatelli, J. P. Chante, G. Lentz, L. Peccoud, Proc. of the First Int. Power Electronics and Motion Control Conf., IPEMC 94, 142 (1994).

The relative charge level of the steps $s_1$ to $s_4$ of a four-zone JTE is described by the relation $$Q_1:Q_2:Q_3:Q_4=100:(50-100):(25-75):(0-50) \qquad (Q_1=Q_0)$$

A two-zone embodiment $Q_1:Q_2=100:(25-75)$.

A three-zone embodiment $Q_1:Q_2:Q_3=100:(30-100):(0-60)$.

FIG. 4 also shows the extension of the depletion region of a reversed biased junction of the shown embodiment. The points indicating the resulting electric field maximum $E_{max}$ are also shown.

Common for all alternatives of the junction described is a passivation layer 10 covering the semiconducting material facing the surface outside the metal contact 2. The passivation layer may, for example, be made of $SiO_2$.

In all embodiments disclosed above, the number of zones of the JTE or the TB is not limited to any specific amount. Any number of zones may be used. The choice of number of zones is dependent on, for example, costs and the complexity of the process.

We claim:

1. A semiconductor device comprising a first conducting type layer and a metal contact layer forming a Schottky junction, the first conducting type later being made of silicon carbide (SiC), and wherein said junction is provided with an edge termination comprising a transition belt (TB) surrounded by a Junction Termination Extension (JTE), said transition belt having increasing charge level outwardly from the junction and said JTE having stepwise or continuously decreasing charge level outwardly.

2. A semiconductor device according to claim 1, wherein said transition belt (TB) comprises a second conducting type layer of SiC applied on top of said first conducting type layer adjacent the metal contact, said second conducting type layer having a tapered wall facing the metal contact and covered by the metal contact.

3. A semiconductor device according to claim 1, wherein said transition belt (TB) comprises TB-zones of said second conducting type SiC material implanted into said first conducting type layer, said zones facing the surface of said first conducting type layer and laterally surrounding said metal contact, the doping concentration of said TB-zones being of such values that the charge level of the transition belt increases laterally outwardly.

4. A semiconductor device according to claim 2, wherein said Junction Termination Extension (JTE) comprises JTE-zones of second conducting type SiC material implanted into said first conducting type layer, said JTE-zones facing the surface of said first layer and laterally surrounding said transition belt (TB), the doping concentration of said JTE-zones being of such values that the charge level of the transition belt decreases laterally outwardly.

5. A semiconductor device according to claim 2, wherein said Junction Termination Extension (JTE) comprises a layer of second conducting type SiC material on top of said first layer, laterally surrounding said transition belt (TB), facing the surface of the semiconductor and wherein said JTE has decreasing thickness outwardly, the charge level of said JTE thus decreasing laterally outwardly.

6. A semiconductor device according to claim 5, wherein said Junction Termination Extension (JTE) comprises JTE-zones formed as at least one step of decreasing thickness outwardly, the charge level of said JTE thus decreasing stepwise laterally outwardly.

7. A semiconductor device according to claim 4 wherein the relative charge level of the steps or zones of the JTE is described by the relations:

a) a four zone JTE: $Q_1:Q_2:Q_3:Q_4=100:(50-100):(25-75):(0-50)$ b) a three zone JTE: $Q_1:Q_2:Q_3=100:(30-100:(0-60)$ c) a two zone JTE: $Q_1:Q_2-100:(25-75)$ d) a one zone JTE: $Q_1=(25-75)Q_0$, wherein $Q_0=100$ is the relative charge density contained within the space charge region of the described pn junction with full voltage, for which it is designed, applied to it, and $Q_1$ being the charge density of the outermost TB zone.

8. A semiconductor device according to claim 3, wherein relative charge level of the zones of the TB is described by the relations:

a) a four zone JTE:$Q_1:Q_2:Q_3:Q_4=100:(50-100):(25-75):(0-50)$ b) a three zone JTE:$Q_1:Q_2:Q_3=100:(30-100:(0-60)$ c) a two zone JTE:$Q_1:Q_2-100:(25-75)$ d) a one zone JTE:$Q_1=(25-75)Q_0$, where $Q_0=100$ is the relative charge density contained within the space charge region of the described pn junction with full voltage, for which it is designed, applied to it, and $Q_1$ being the charge density of the outermost TB zone.

9. A method of manufacturing a semiconductor device comprising a first conducting type layer and a metal contact layer forming a Schottky junction, wherein the first conducting type layer is made of Silicon Carbide (SiC), said method including the steps of: providing the surface of said first conducting type layer outside the edge of the Schottky junction with an edge termination by forming a transition belt (TB) having outwardly increasing charge level and forming a Junction Termination Extension (JTE) surrounding said transition belt (TB), said JTE having stepwise or continuously decreasing charge level.

10. A method according to claim 9, wherein said transition belt (TB) is formed by means of LOCOS technique to have an inwardly tapered wall.

11. A method according to claim 10, wherein said metal layer is formed to cover said tapered wall.

12. A method according to claim 10, wherein said JTE is formed by implantation of ions to form zones of a second conducting type at the surface of said first conducting type layer.

13. A method according to claim 10, wherein said JTE zones are implanted by means of a stepwise masking and implantation process to establish JTE zones of decreasing charge level outwardly from the junction.

14. A method according to claim 10, wherein the implant used to form JTE zones of p-conducting type is aluminum, boron or gallium, while the implant used to form JTE zones of n-conducting type is nitrogen.

15. A method of manufacturing a semiconductor device comprising a first conducting type layer and a metal contact layer forming a Schottky junction, wherein the first conducting type layer is made of silicon carbide (SiC), the method comprising the steps of:

epitaxially growing a second layer of a second conducting type SiC material on top of said first layer, etching a trench with tapered walls down to said first layer in a center of said second layer, applying a Schottky contact in said trench, and forming said second layer to have outwardly decreasing thickness.

16. A method according to claim 15, comprising the step of etching said second layer in steps to have one or a plurality of steps, with each outward step having decreasing thickness.

17. A method according to claim 15, comprising the step of laterally growing said second layer, said growth being controlled to form said second layer with continuously decreasing thickness.

* * * * *